United States Patent
Blackwell et al.

(10) Patent No.: US 11,309,435 B2
(45) Date of Patent: Apr. 19, 2022

(54) BANDGAP REFERENCE CIRCUIT INCLUDING VERTICALLY STACKED ACTIVE SOI DEVICES

(71) Applicant: GLOBALFOUNDRIES U.S. Inc., Santa Clara, CA (US)

(72) Inventors: Don Raymond Blackwell, Santa Clara, CA (US); Peter P. Hang, Santa Clara, CA (US); Van Ton-That, San Jose, CA (US); Timothy S. Miller, Saratoga, CA (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 50 days.

(21) Appl. No.: 16/812,583

(22) Filed: Mar. 9, 2020

(65) Prior Publication Data
US 2021/0280723 A1    Sep. 9, 2021

(51) Int. Cl.
*H01L 29/66*    (2006.01)
*H01L 29/808*    (2006.01)
(Continued)

(52) U.S. Cl.
CPC .... *H01L 29/8083* (2013.01); *H01L 21/02576* (2013.01); *H01L 21/02579* (2013.01);
(Continued)

(58) Field of Classification Search
CPC ............ H01L 29/8083; H01L 29/0611; H01L 29/165; H01L 29/66166; H01L 29/8611;
(Continued)

(56) References Cited

U.S. PATENT DOCUMENTS 6,489,835 B1 * 12/2002 Yu .............................. G05F 3/30
  323/313
7,629,785 B1 * 12/2009 Drebinger ................. G05F 3/30
  323/313

(Continued)

OTHER PUBLICATIONS

Fayomi, Christian Jesus B, et al.; "Sub 1 V CMOS bandgap reference design techniques: a survey"; Springer Link; Feb. 2010; vol. 62; Issue 2; pp. 141-157; Printed Nov. 14, 2019; Abstract Only; pp. 8; <https://link.springer.com/article/10.1007/s10470-009-9352-4>.

(Continued)

*Primary Examiner* — Calvin Y Choi
(74) *Attorney, Agent, or Firm* — Hoffman Warnick LLC

(57) ABSTRACT

Embodiments of the disclosure provide a bandgap reference circuit, including: first and second vertically stacked structures, the first and second vertically stacked structures each including: a P-type substrate; a P-well region within the P-type substrate; an N-type barrier region between the P-type substrate and the P-well region, the P-well region and the N-type barrier region forming a PN junction; a field effect transistor (FET) above the P-well region, separated from the P-well region by a buried insulator layer, the P-well region forming a back gate of the FET; and a first voltage source coupled to the P-well and applying a forward bias to a diode formed at the PN junction between the P-well region and the N-type barrier region.

19 Claims, 8 Drawing Sheets

(51) Int. Cl.
*H01L 29/165* (2006.01)
*H01L 29/06* (2006.01)
*H01L 21/02* (2006.01)
*H01L 29/861* (2006.01)

(52) U.S. Cl.
CPC ........ *H01L 29/0611* (2013.01); *H01L 29/165* (2013.01); *H01L 29/66166* (2013.01); *H01L 29/8611* (2013.01)

(58) Field of Classification Search
CPC ......... H01L 21/02576; H01L 21/02579; H01L 27/2454; H01L 29/7827; H01L 21/823487; H01L 21/823885; H01L 21/8224; H01L 21/82285; H01L 27/0652; H01L 27/0658; H01L 27/0664; H01L 27/0716; H01L 27/0755–0777; H01L 27/0821; H01L 27/0823–0828; H01L 29/66333–66348; H01L 29/732–7327; H01L 29/7371–7378; H01L 29/7395–7398; G01R 19/00–32; G01R 25/00–08
USPC ........................................................ 257/256
See application file for complete search history.

(56) References Cited

U.S. PATENT DOCUMENTS

| | | | |
|---|---|---|---|
| 2010/0134081 A1* | 6/2010 | Oki ........................ | H02M 3/06 323/282 |
| 2010/0259185 A1* | 10/2010 | Sadwick ................ | H03K 17/72 315/291 |
| 2018/0074532 A1* | 3/2018 | Mandal ..................... | G05F 3/30 |
| 2019/0356305 A1* | 11/2019 | Ozawa ................. | H03K 17/687 |

OTHER PUBLICATIONS

Jiang, Yueming, et al.; "Design of low-voltage bandgap reference using transimpedance amplifier"; IEEE Transactions on Circuits and Systems II: Analog and Digital Signal Processing; Abstract Only; Published Jun. 2000; vol. 47; Issue 6; pp. 2; Copyright 2019 IEEE; <https://ieeexplore.ieee.org/abstract/document/847072>.

Ker, Ming-Dou, et al.; "A CMOS Bandgap Reference Circuit for Sub-1-V Operation Without Using Extra Low-Threshold-Voltage Device"; ISCAS; 2004; pp. I-41-I-44; Copyright 2004 IEEE.

Kwon, Yong-Jin, et al.; "Sub-1-V-Output CMOS bandgap reference circuit with small area and low power consumption"; ELectronics EXpress; Published Feb. 10, 2009; IEICE Electronics Express; vol. 6; No. 3; pp. 161-166; Copyright IEICE 2009.

Lasanen, K et al.; "Design of a 1 V low power CMOS bandgap reference based on resistive subdivision"; IEEE; The 2002 45th Midwest Symposium on circuits and Systems; MWSCAS—2002; pp. 7.

* cited by examiner

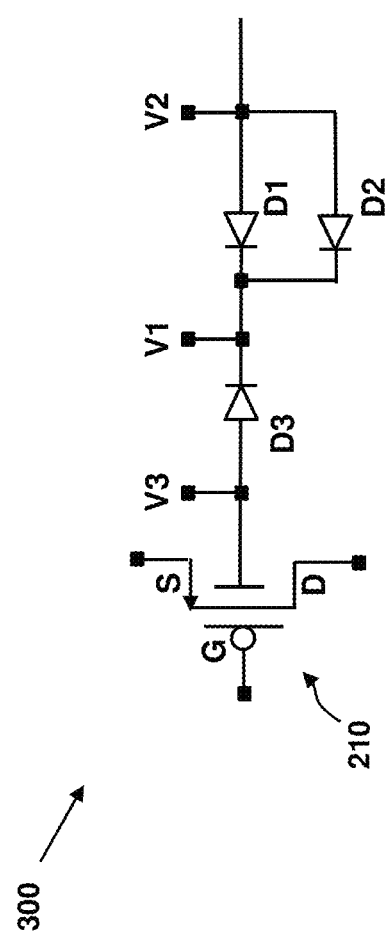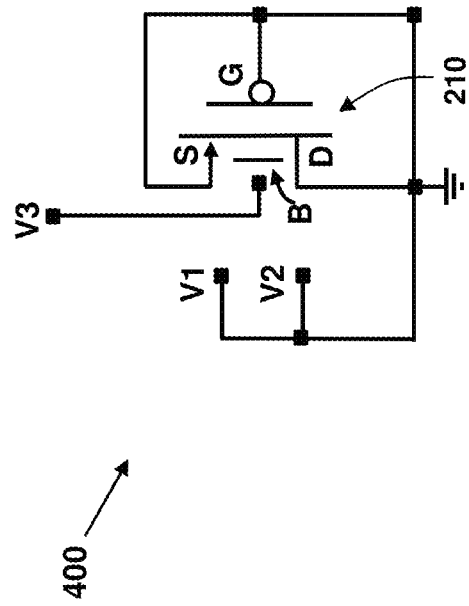

BANDGAP REFERENCE CIRCUIT INCLUDING VERTICALLY STACKED ACTIVE SOI DEVICES

BACKGROUND

The present disclosure relates to integrated circuits, and more specifically, to a bandgap reference circuit including vertically stacked active silicon-on-insulator (SOI) devices.

In many state of the art integrated circuits, an accurate voltage reference that has a low sensitivity to the supply voltage, low sensitivity to variable process and model parameters, and low sensitivity to temperature is required. The bandgap voltage of silicon is independent of supply voltage, nearly independent of temperature, and shows almost no dependence upon process. For these reasons, most accurate voltage references that are used today are designed to have an output voltage that is proportional to the bandgap voltage. Such a voltage reference is referred to as a "bandgap reference."

Many conventional bandgap reference circuits utilize bipolar transistors in a diode-connected configuration. When implemented a bandgap reference circuit using complementary metal-on-insulator (CMOS) devices, the bipolar transistors are implemented using parasitic vertically stacked PNP (VPNP) devices in a diode-connected configuration. However, VPNP devices are typically very large compared to surrounding CMOS devices.

SUMMARY

A first aspect of the disclosure is directed to a bandgap reference circuit, including: first and second vertically stacked structures, the first and second vertically stacked structures each including: a P-type substrate; a P-well region within the P-type substrate; an N-type barrier region between the P-type substrate and the P-well region, the P-well region and the N-type barrier region forming a PN junction; a field effect transistor (FET) above the P-well region, separated from the P-well region by a buried insulator layer, the P-well region forming a back gate of the FET; and a first voltage source coupled to the P-well and applying a forward bias to a diode formed at the PN junction between the P-well region and the N-type barrier region.

A second aspect of the disclosure is directed to an integrated circuit, including: a bandgap reference circuit for generating a reference current, the bandgap reference circuit including: first and second vertically stacked structures, the first and second vertically stacked structures each including: a P-type substrate; a P-well region within the P-type substrate; an N-type barrier region between the P-type substrate and the P-well region, the P-well region and the N-type barrier region forming a PN junction; a field effect transistor (FET) above the P-well region, separated from the P-well region by a buried insulator layer, the P-well region forming a back gate of the FET, wherein the FET in the first vertically stacked structure and the FET in the second vertically stacked structure form a current mirror; and a first voltage source coupled to the P-well and applying a forward bias to a diode formed at the PN junction between the P-well region and the N-type barrier region, wherein the first voltage source concurrently biases the back gate of the FET.

A third aspect of the disclosure is directed to bandgap reference circuit with vertically stacked active silicon-on-insulator (SOI) devices, including: a P-type substrate; a P-well region within the P-type substrate; an N-type barrier region between the P-type substrate and the P-well region, the P-well region and the N-type barrier region forming a PN junction; a field effect transistor (FET) above the P-well region, separated from the P-well region by a buried insulator layer, the P-well region forming a back gate of the FET; and a first voltage source coupled to the P-well and applying a forward bias to a diode formed at the PN junction between the P-well region and the N-type barrier region, wherein the first voltage source concurrently biases the back gate of the FET.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements.

FIG. 3 is an equivalent circuit for the semiconductor structure 200 depicted in FIG. 2, according to embodiments.

FIG. 4 is equivalent circuit of the semiconductor structure of FIG. 2 in a diode-connected configuration, according to embodiments.

Figure 1:
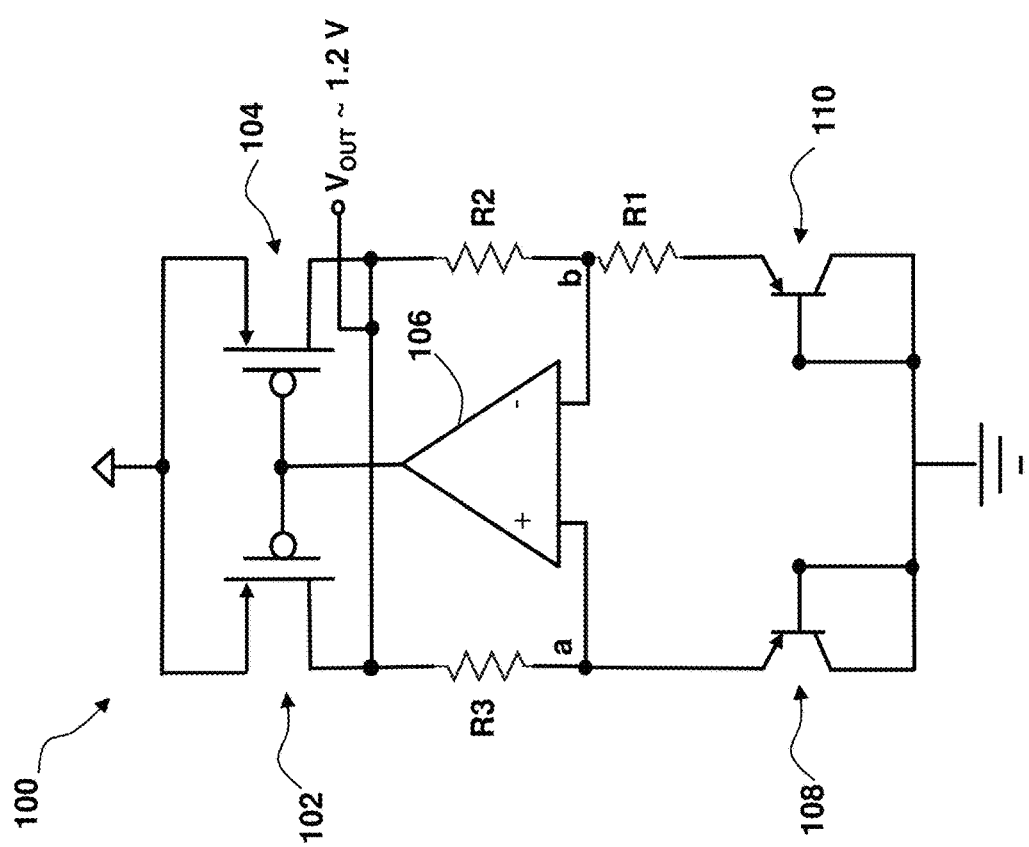
FIG. 1 depicts a conventional bandgap reference circuit.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

A bandgap reference circuit implemented using vertically stacked active silicon-on-insulator (SOI) devices according to embodiments is described herein. A very compact bandgap reference circuit is provided by stacking active SOI devices (e.g., field effect transistors (FETs)) over diodes) to significantly reduce the area required by the bandgap reference circuit.

FIG. 1 depicts a conventional complementary metal-on-insulator (CMOS) bandgap reference circuit 200. The bandgap reference circuit 200 includes FETs 102, 104, an operational amplifier 106, resistors R1, R2, R3, and bipolar transistors (BJTs) 108, 110 (e.g., parasitic VPNP devices) in a diode-connected configuration.

The bandgap reference circuit 100 is used to generate a voltage reference (~1.2 V) that remains stable over a wide temperature range. The operational amplifier 106 ensures that the voltage at nodes 'a' and 'b' are at the same voltage. There is a voltage difference between the two BJTs 108, 120 caused by the difference in their device sizes (e.g., 8:1 in this example). This voltage appears across resistor R1, and is referred to as a 'proportional to absolute temperature' (PTAT) voltage. Typically, to obtain a size difference of N between the BJTs 108, 110 in the design of the bandgap reference circuit 100, the BJT 108 is copied and placed N times in the design to create the BJT 110, resulting in a size ratio between the BJT 108 and the BJT 110 of 1:N.

In contrast to the PTAT voltage, the voltage across the BJTs 108, 110 is a 'complementary to absolute temperature' (CTAT) voltage. The CTAT voltage and the PTAT voltage, which is scaled up using the resistor R2, are added together so that their temperature dependencies cancel. The resultant output voltage $V_{OUT}$ at the node connecting the resistors R2 and R3 remains approximately constant over temperature.

Figure 2:
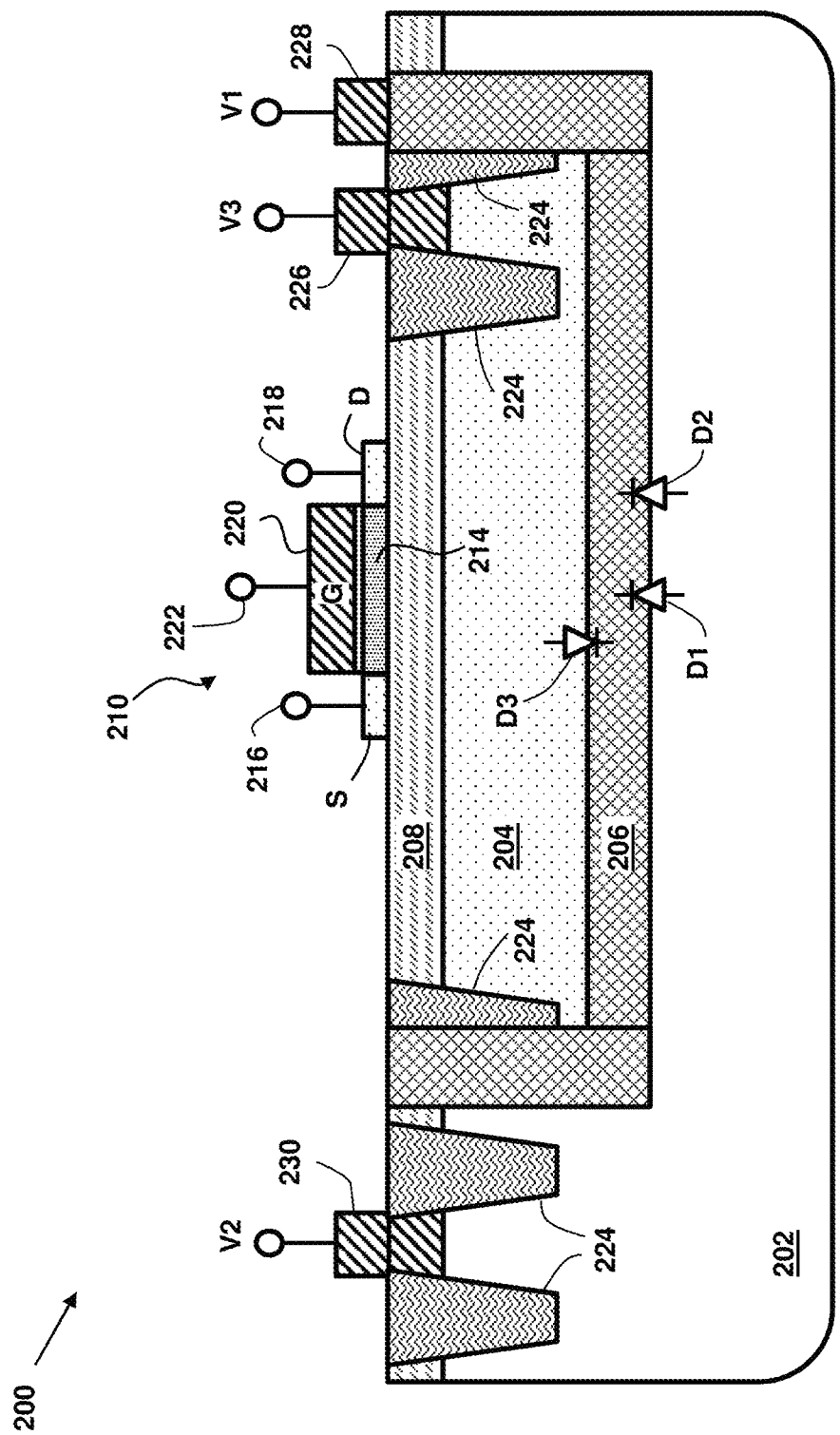
FIG. 2 depicts a semiconductor structure with vertically stacked active silicon-on-insulator (SOI) devices according to embodiments.

A semiconductor structure 200 (structure 200) including vertically stacked active silicon-on-insulator (SOI) devices according to embodiments is depicted in FIG. 2. An equivalent circuit 300 for the structure 200 is depicted in FIG. 3. An equivalent circuit 400 with the structure 200 in a diode-connected configuration is depicted in FIG. 4. As will be presented in greater detail herein, the structure 200 may be included in a bandgap reference circuit to significantly reduce power requirements and the area required by the bandgap reference circuit (e.g., on an integrated circuit (IC) chip/device. The structure 200 includes a PNP junction vertically beneath and aligned with a FET. The PNP junction may operate as a BJT and may be configured to operate as a diode. In this context, "vertically aligned" or "vertical alignment" refers to the FET being positioned vertically above two PN junctions, which together form the PNP junction and are at least partially horizontally overlapping relative to a source-to-drain electrical pathway across the FET.

A PN junction is a device structure in which P-type and N-type semiconductor regions are brought into contact with each other, thereby creating a potential barrier. The size of the potential barrier is determined by the bias applied between the P-type and N-type regions. A PN junction, when formed in a device, may operate as a diode. A diode is a two-terminal element which behaves differently from conductive or insulative materials between two points of electrical contact. Specifically, a diode provides high conductivity from one contact to the other in one direction (i.e., the 'forward' direction) but provides little to no conductivity in the opposite direction (i.e., the 'reverse' direction). In the case of the PN junction, the orientation of a diode's forward and reverse directions may be contingent on the type and magnitude of bias applied to the material composition of one or both terminals, which affects the size of the potential barrier. In the case of a junction between two semiconductor materials, the potential barrier will be formed along the interface between the two semiconductor materials.

The structure 200 may be formed from a substrate 202 including, e.g., one or more semiconductor materials, and may be implanted with P-type dopants. The structure 200 may also include a P-well region 204 formed within the substrate 202, e.g., by vertical ion implantation, such that an upper surface of the P-well region 204 is aligned, and thus shared, with an upper surface of the substrate 202. Although the P-well region 204 may have the same doping type as the substrate 202, the P-well region 204 may have a higher or lower dopant concentration than substrate 202. The P-well region 204 thus may be distinguished from the substrate 202 at least partially based on its doping concentration, dopant materials, etc., even where the P-well region 204 and the substrate 202 are of the same doping type.

To form a three terminal PNP junction (e.g., for a BJT) as discussed herein, the structure 200 may include an N-type doped barrier region 206 (barrier region 206) between the substrate 202 and the P-well region 204. The barrier region 206 may be formed within the substrate 202 before the P-well region 204 is formed, and the P-well region 204 in such cases may be formed within the barrier region 206. In any case, the barrier region 206 may be formed within the substrate 202 to a depth less than the total thickness of the substrate 202, but may have an upper surface coincident with the upper surface of the P-well region 204. The barrier region 206 may be formed by implanting N-type dopants into the substrate 202 and/or precursor semiconductor material by any currently known or later developed technique, e.g., ion implantation. N-type dopants are elements introduced into semiconductor materials to generate free electrons, e.g., by "donating" an electron to semiconductor. N-type dopants must have one more valance electron than the semiconductor. Common N-type donors in silicon (Si) include, e.g., phosphorous (P), arsenic (As), and/or antimony (Sb).

Transistors (e.g., FET 210 discussed herein) and/or other devices may be formed on the P-well region 204 to drive various operations of a device, e.g., logic, electrical functions, etc. In the structure 200, the P-well region 204 may act as a back gate region for controlling the electrical properties of a transistor formed thereon. A buried insulator layer 208, also known in the art as a "buried oxide" or "BOX" layer, can separate the P-well region 204, as well as the substrate 202 and the barrier layer 206 where applicable, from overlying portions of a transistor structure, such as the FET 210. The buried insulator layer 208 may be composed of one or more oxide compounds, and/or any other currently known or later-developed electrically insulative substances. The buried insulator layer 208 may be sized as narrow as possible to provide better interaction with the P-well region 204. Where transistors formed on the buried insulator layer 208 also feature functional components of a similar thickness scale, the structure 200 may be considered to be a "fully depleted semiconductor on insulator" (FDSOI) structure. Because of the use of the P-well region 204, the structure 200 can be considered to be a 'flipped well' device. The use of FDSOI technology provides various advantages such as an adjustable electric transistor potential by applying a bias to the P-well region 204.

A FET 210 may be formed over the buried insulator layer 208, such that the buried insulator layer 208 physically separates the FET 210 from the P-well region 204. The FET 210 may take the form of a three-terminal transistor according to any one of several device architectures. The FET 210 is shown for the purposes of example as being a planar FET, but it is understood that various embodiments of the disclosure may also include FET(s) 210 in the form of fin-type FETs ("FinFETs"), nanosheet transistors, vertically-oriented FET(s) ("VFETs"), and/or any other currently known or later developed transistor architecture, and may include P and N-type FETs. The buried insulator layer 208 can separate the P-well region 204 from a source (S) region, a drain (D) region, and a channel region 214 positioned between the source S and drain D regions.

The source S and drain D regions and the channel region 214 of the FET 210 may electrically couple a source terminal 216 of the FET 210 to a drain terminal 218 when the FET 210 is in an on state. A gate (G) stack 220 can be positioned over the channel region 214, such that a voltage applied to the gate terminal 222 controls the electrical conductivity between the source and drain terminals 216, 218 through the source S and drain D regions and the channel region 214. The gate stack 220 can have, e.g., one or more electrically conductive metals therein, in addition to a gate dielectric material (indicated with white space between bottom of the gate stack 220 and the channel region 214) for separating the conductive metal(s) of the gate stack 220 from at least the channel region 214. In conventional settings, the FET 210 would be the single electrically active component formed over a respective portion of the substrate 202. Embodiments of the disclosure, however, allow a PNP junction, and thus a BJT or one or more diodes, to be formed in vertical alignment with the FET 210. To form the PNP junction, biases may be applied to the various doped semiconductor materials (i.e., the substrate 202, the P-well region 204, and the barrier region 206) in the structure 200.

To apply independent biases to the substrate 202, the P-well region 204, and the barrier region 206, embodiments of the disclosure may include forming conductive elements to each of the respective regions. To prevent electrical shorting and/or unintended biasing of nearby elements, the structure 200 may include a group of trench isolation regions 224 for electrically and physically separating the various doped materials of structure 200 from each other. The trench isolation regions 224 may be composed of an insulating material such as silicon dioxide ($SiO_2$) or a 'high-k' dielectric. The trench isolation regions 224 may be formed by etching targeted portions of the structure 200 to create openings and forming one or more insulative materials within the openings, e.g., by deposition.

As shown, the trench isolation regions 224 may be positioned adjacent the interior vertical surfaces of the barrier region 206. The trench isolation regions 224 may be formed to separate various contacts from each other and/or from other doped materials of the structure 200. For example, the structure 200 may include a contact 226 to the P-well region 204. The contact 226 (and other contacts described herein) may include one or more conductive materials formed on and/or partially within the P-well region 204, e.g., one or more conductive metals and/or conductive silicide regions. The contact 226 additionally may include, e.g., refractory metal liners (not shown) to horizontally separate conductive materials of the contact 226 from the trench isolation regions 224 and/or other horizontally adjacent materials. Such liners may include materials such as but not limited to: tantalum nitride (TaN) and tantalum; tantalum nitride, tantalum and cobalt; and magnesium (Mn), or combinations thereof.

A voltage source V1 may be electrically coupled to a contact 228 to apply a respective bias to the barrier region 206. In addition, a voltage source V2 may be electrically coupled to a contact 230 to apply a respective bias to the substrate 202. Further, a voltage source V3 may be electrically coupled to the contact 226 to apply a voltage bias (e.g., 'back gate bias') to the P-well region 204. In the case of an FDSOI transistor architecture, the voltage source V3 may influence the initial conductivity between the source S and drain D regions of the FET 200 through the channel region 214. Applying a voltage V3 to the contact 226 can induce an electric charge within the P-well region 204, which creates a difference in electrical potential between the P-well region 204, the source S and drain D regions, and the channel region 214 across the buried insulator layer 208. Among other effects, this difference in the electrical potential between the P-well region 204, the source S and drain D regions, and the channel region 214, can affect the threshold voltage VT of the FET 210. The threshold voltage VT of the FET 210 refers to the minimum voltage for inducing electrical conductivity across the channel region 214 between the source S and drain D regions. Electrically biasing the P-well region 204 may reduce or increase the threshold voltage VT required to operate the FET 210. These characteristics of an FDSOI structure, among other things, can allow a reduced width (saving silicon area) relative to conventional applications and transistor structures.

FDSOI technology transistors, where included in the structure 200, offer the ability to apply a bias to the P-well region 204 to manipulate the threshold voltage VT (i.e., minimum voltage for channel formation) of the FET 210. As noted herein, the bias applied to the P-well region 204 may also be electrically coupled to other elements of the structure 200 to provide additional functions and/or elements of the structure 200.

Parasitic diodes D1, D2, and D3, may be formed within the structure 200, below the FET 210. Parasitic diodes D1 and D2 may be formed at the PN junction formed between the substrate 202 and the barrier region 206. Parasitic diode D3 is formed at the PN junction formed between the P-well region 204 and the barrier region 206. According to embodiments, the voltage sources V1 and V2 may be used to apply a negative bias to the substrate 202 and the barrier region 206 to reverse bias the diodes D1, D2, while the voltage source V3 may be used to apply a positive bias to the P-well region 204 to forward bias the diode D3. An equivalent circuit 300 for the structure 200 is depicted in FIG. 3.

An equivalent 'diode' circuit 400 of the structure 200 in a diode-connected configuration is depicted in FIG. 4. In the diode-connected configuration, the gate G, source S, and drain D of the FET 210 are connected to ground. The voltages V1 and V2 are also connected to ground. A positive bias voltage (V3) is applied to the back gate B (e.g., P-well region 204) of the structure 200.

Figure 5:
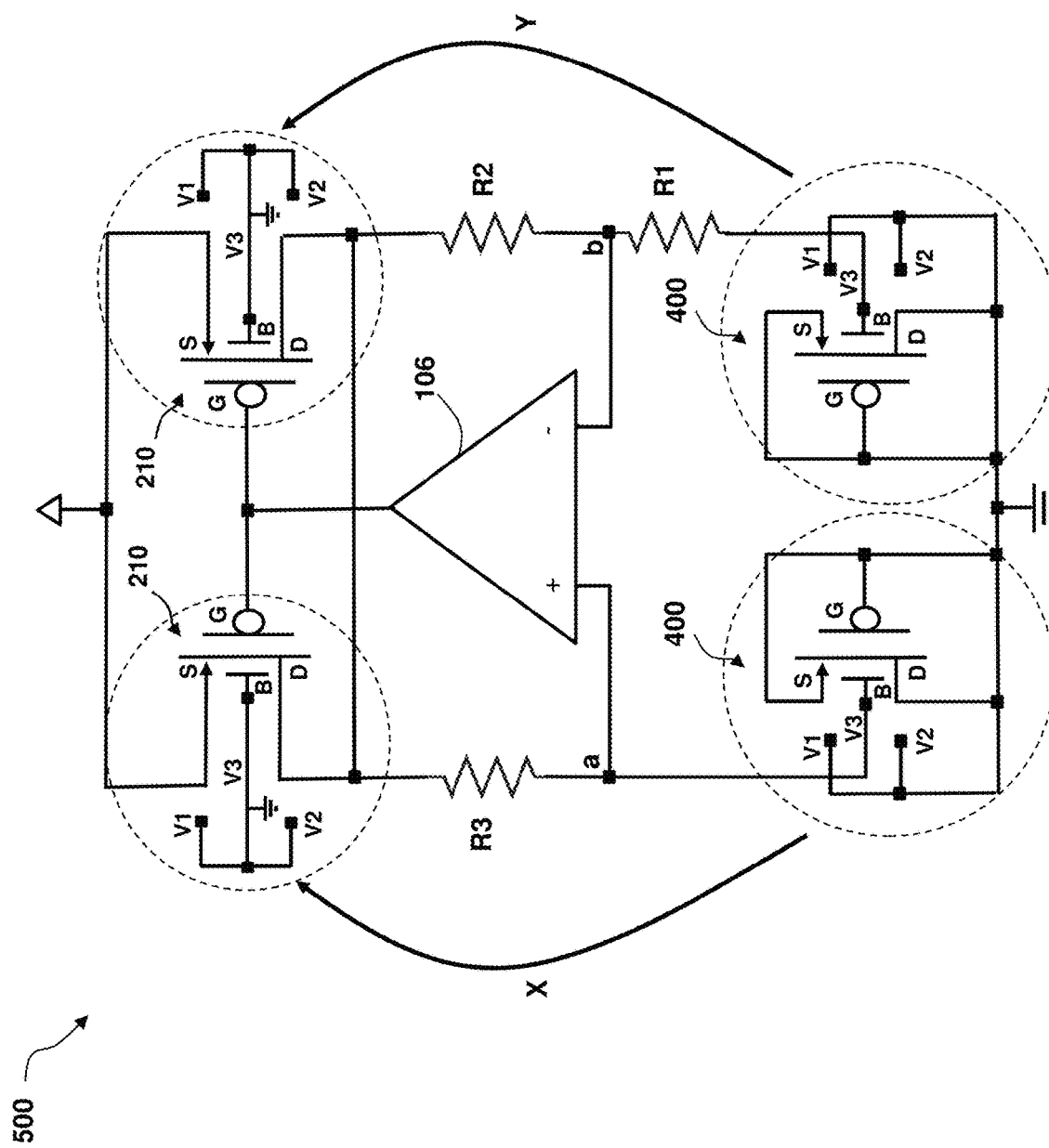
FIG. 5 depicts a bandgap reference circuit according to embodiments.

FIG. 5 depicts a bandgap reference circuit 500 according to embodiments. Comparing FIG. 1 with FIG. 5, it can be seen that each of the FETs 102, 104 (FIG. 1) has been replaced using the FET 210 in the structure 200. In addition, each of the parasitic VPNP devices (e.g., the BJTs 108, 110 in a diode-connected configuration) has been replaced with the diode circuit 400 in the structure 200 (e.g., the structure 200 is in a diode-connected configuration). To this extent, four instances of the structure 200 are required to implement the bandgap reference circuit 500 shown in FIG. 5. In the structures 200 containing the FETs 210, the voltages V1, V2, and V3 are tied to ground. In the diode circuits 400, the voltages V1, V2 are tied to ground and the voltage V3 is the voltage at the node 'a', or at the node 'b'.

Figure 6:
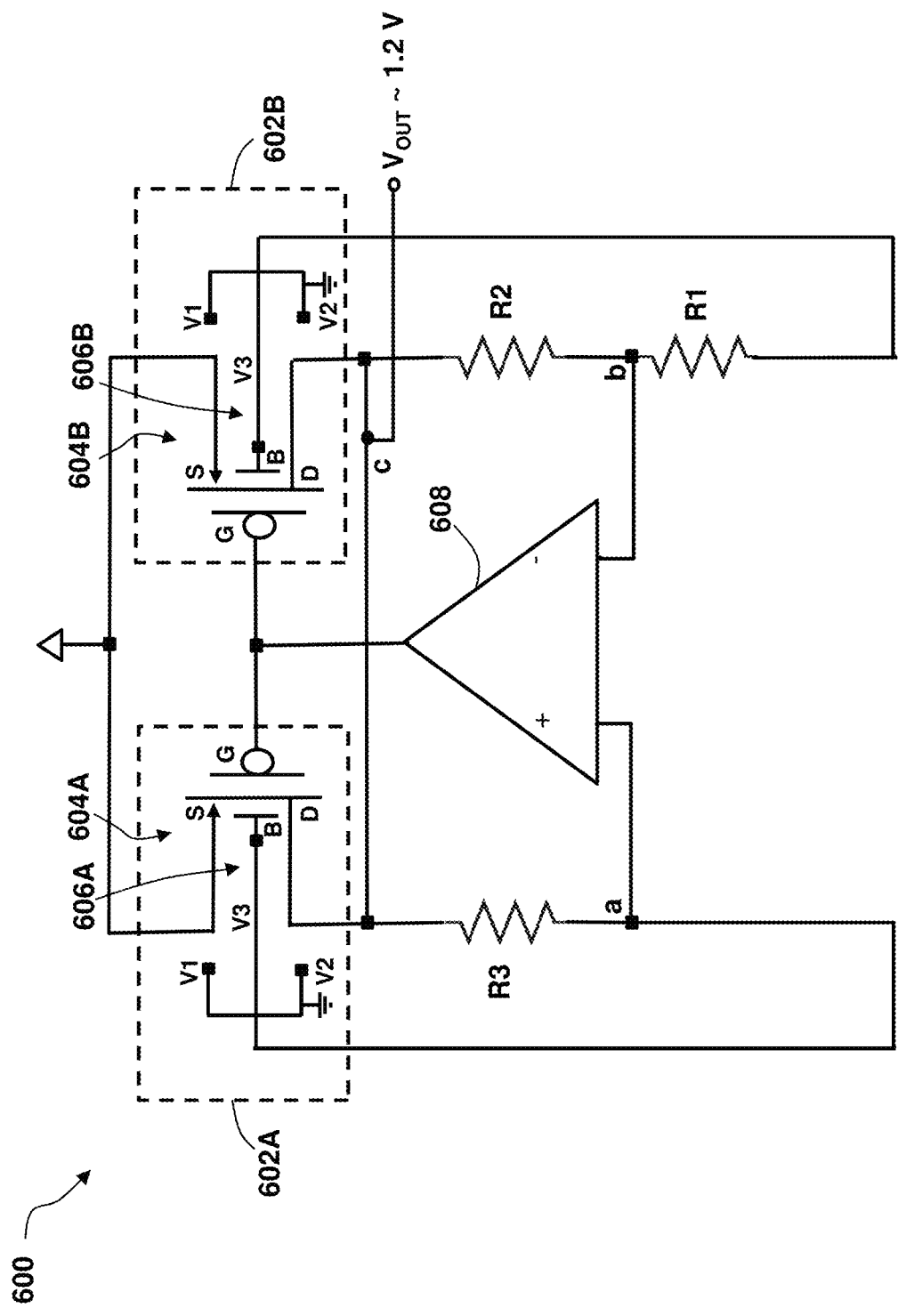
FIG. 6 depicts a bandgap reference circuit according to embodiments.

According to embodiments of the disclosure, the vertical stacking of active devices in the structure 200 can be exploited to provide a bandgap reference circuit 600 that requires significantly less area (e.g., on an IC), without sacrificing performance. For example, in the bandgap reference circuit 600 depicted in FIG. 6, a combined device 602 (e.g., 602A, 602B) is provided (using the structure 200) that combines the functionality of the FET 210 and the diode circuit 400 (as indicated by arrows X, Y in FIG. 5).

Similar to the bandgap reference circuit 100 depicted in FIG. 1, the bandgap reference circuit 600 is configured to generate a reference output voltage $V_{OUT}$ (~1.2 V) at an output node 'c' which remains stable over a wide temperature range. Each combined device 602A, 602B includes a FET 604A, 604B and a forward biased parasitic diode 606A, 606B. The FETS 604A, 604B form a current mirror.

There is a voltage difference between the two FETs 604A, 604B caused by the difference in their device sizes (e.g., 8:1 in this example). This voltage appears across resistor R1, and is referred to as a 'proportional to absolute temperature' (PTAT) voltage. The size difference N between the FETs 604A, 604B may be obtained in a number of ways. For example, to obtain a size difference of N between the FETs 604A, 604B in the design of the bandgap reference circuit 600, the FET 604A (and other portions of the structure 200 (e.g., P-well region 204, barrier region 206, substrate 202, etc.)) may be copied and placed N times to create the FET 604B in the design, resulting in a size ratio between the FET 604A and the FET 604B of 1:N.

The voltage across the parasitic diodes 606A, 606B is the 'complementary to absolute temperature' (CTAT) voltage. The CTAT voltage and the PTAT voltage, which is scaled up using the resistor R2, are added together so that their temperature dependencies cancel. The resultant output voltage $V_{OUT}$ at the node 'c' connecting the resistors R2 and R3 remains approximately constant over temperature.

In the bandgap reference circuit 600, the voltages V1, V2 are tied to ground and the voltage at both of the nodes 'a' and 'b' is V3. The diode 606A in the combined device 602A is forward biased by applying the voltage V3 at node 'a' to the back gate B of the FET 604A. The diode 606B is forward biased by applying the voltage V3 at node 'b' to the back gate B of the FET 604B. The source S of each FET 604A, 604B is tied to a supply voltage VDD.

The inputs of an operational amplifier 608 are coupled to nodes 'a' and 'b'. The output of the operational amplifier 608 is coupled to the gate G of each FET 604A, 604B. The operational amplifier 608 ensures that the voltage at nodes 'a' and 'b' is at the same voltage V3.

The resistor R1 is connected between node 'b' and the back gate B of the FET 604B in the combined device 602B. The resistor R2 is connected between node 'b" and the drain of the FET 604B. The resistor R3 is connected between node 'a' and the drain D of the FET 604A in the combined device 602A.

As described herein, the vertical stacking of active devices in the structure 200 can be exploited to provide a bandgap reference circuit 600 that requires significantly less area (e.g., on an IC), without sacrificing performance. Based on simulated and measured silicon (Si) results, and similar to conventional bandgap reference circuits, the bandgap reference circuit 600 is capable of producing an output voltage $V_{OUT}$ of ~1.2 V, independently of supply voltage VDD and over a wide range of temperatures. Further, again compared to conventional bandgap reference circuits, the bandgap reference circuit 600 requires less supply current ($I_{DD}$) and thus has a lower power requirement.

Figure 7:
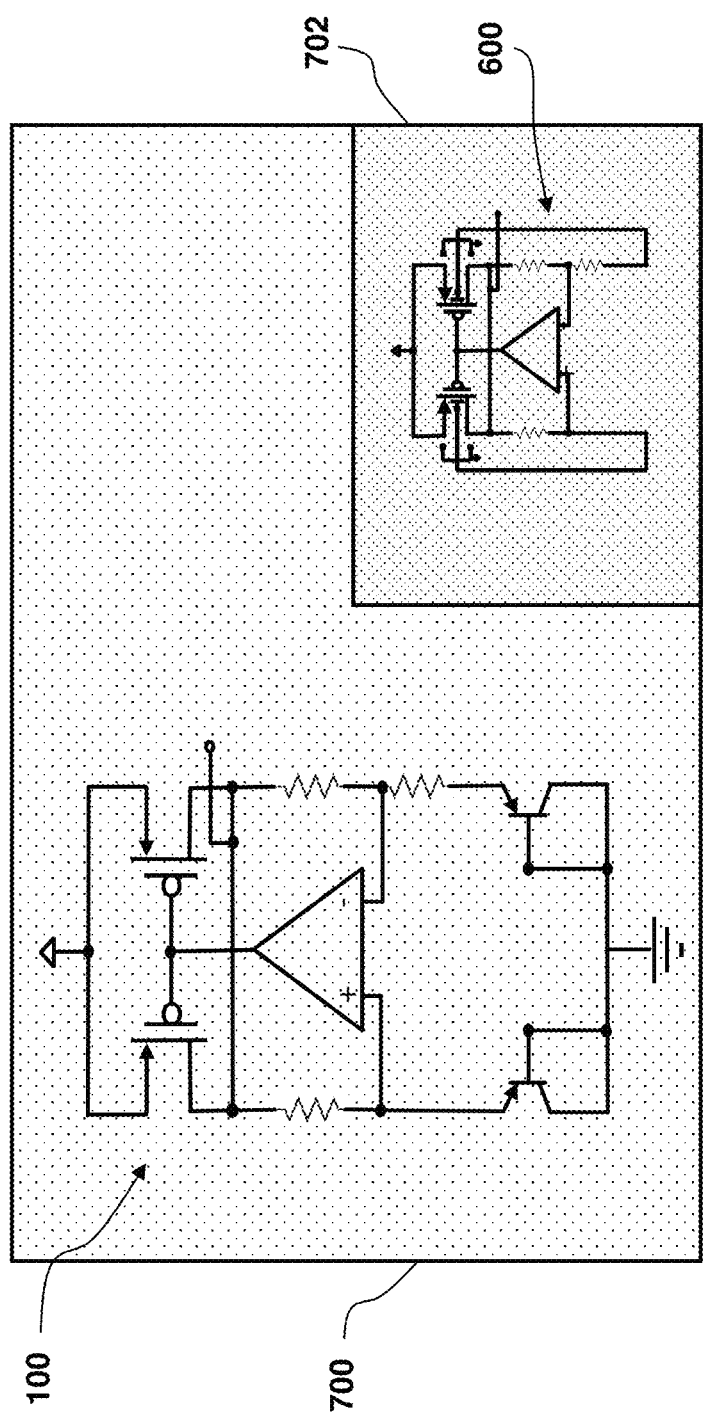
FIG. 7 depicts an example of the area reduction provided by a bandgap reference circuit according to embodiments.

An example of the area reduction provided by the bandgap reference circuit 600 is depicted in FIG. 7. The larger rectangle 700 represents the area required to implement a conventional bandgap reference circuit including parasitic vertical PNP transistors (e.g., the bandgap reference circuit 100 (FIG. 1)), designed in silicon (Si) using a given semiconductor processing technology (e.g., GlobalFoundries 22FDX). The smaller rectangle 702 represents the area required by a bandgap reference circuit 600 according to embodiments, designed in Si using the same semiconductor processing technology. Area and supply current ($I_{DD}$) measurements for the conventional bandgap reference circuit and the bandgap reference circuit 600 are provided below:

Conventional Bandgap Reference Circuit (Area=6760µ$^2$, $I_{DD}$=97 µA);

Bandgap Reference Circuit 600 (Area=1050µ$^2$, $I_{DD}$=34 µA).

To this extent, the bandgap reference circuit 600 provides an area reduction of about 85% and a supply current reduction of about 65%.

Figure 8:
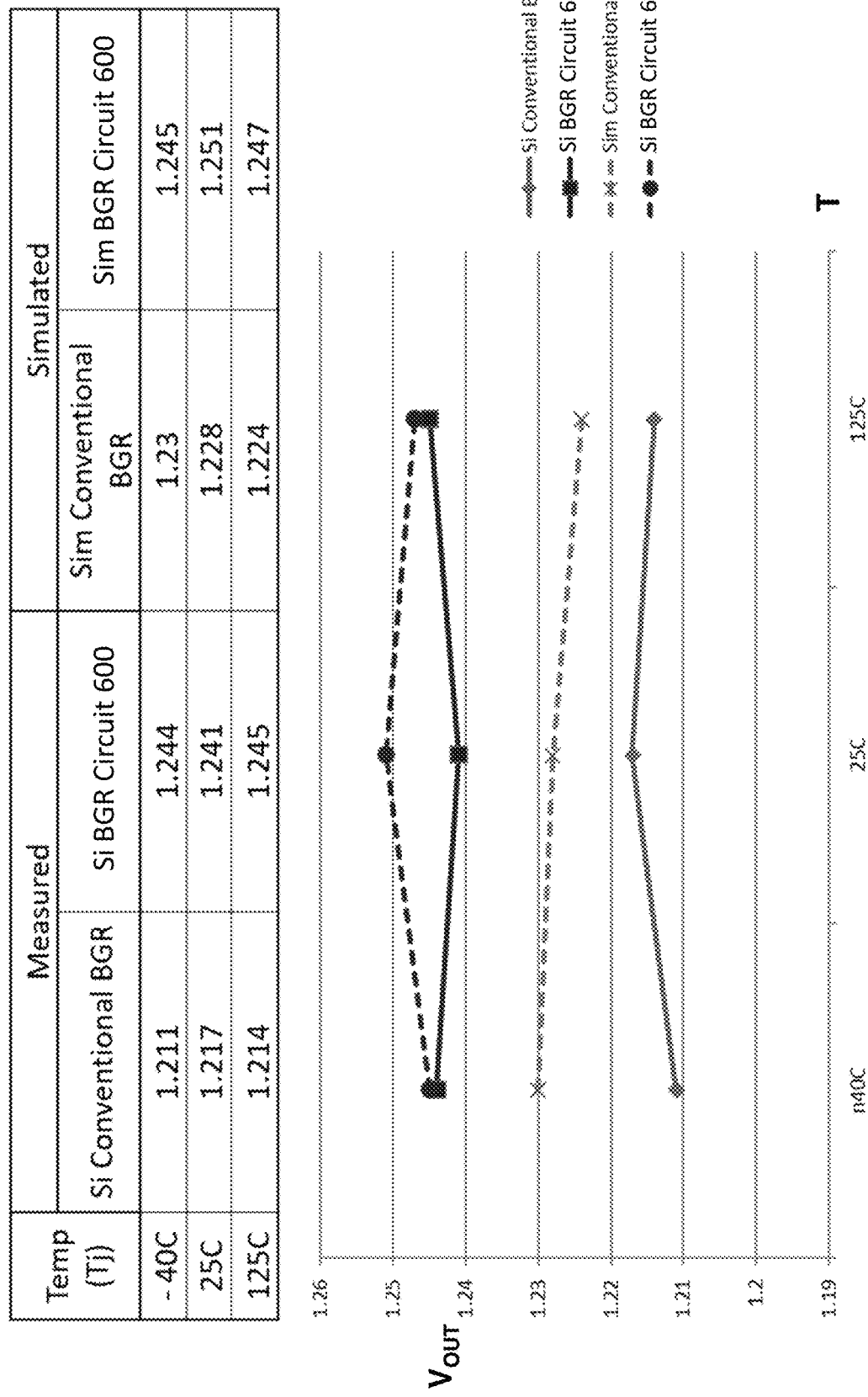
FIG. 8 depicts output voltages (measured and simulated) at different temperatures for a conventional bandgap reference and a bandgap reference circuit according to embodiments.
Figure 9:
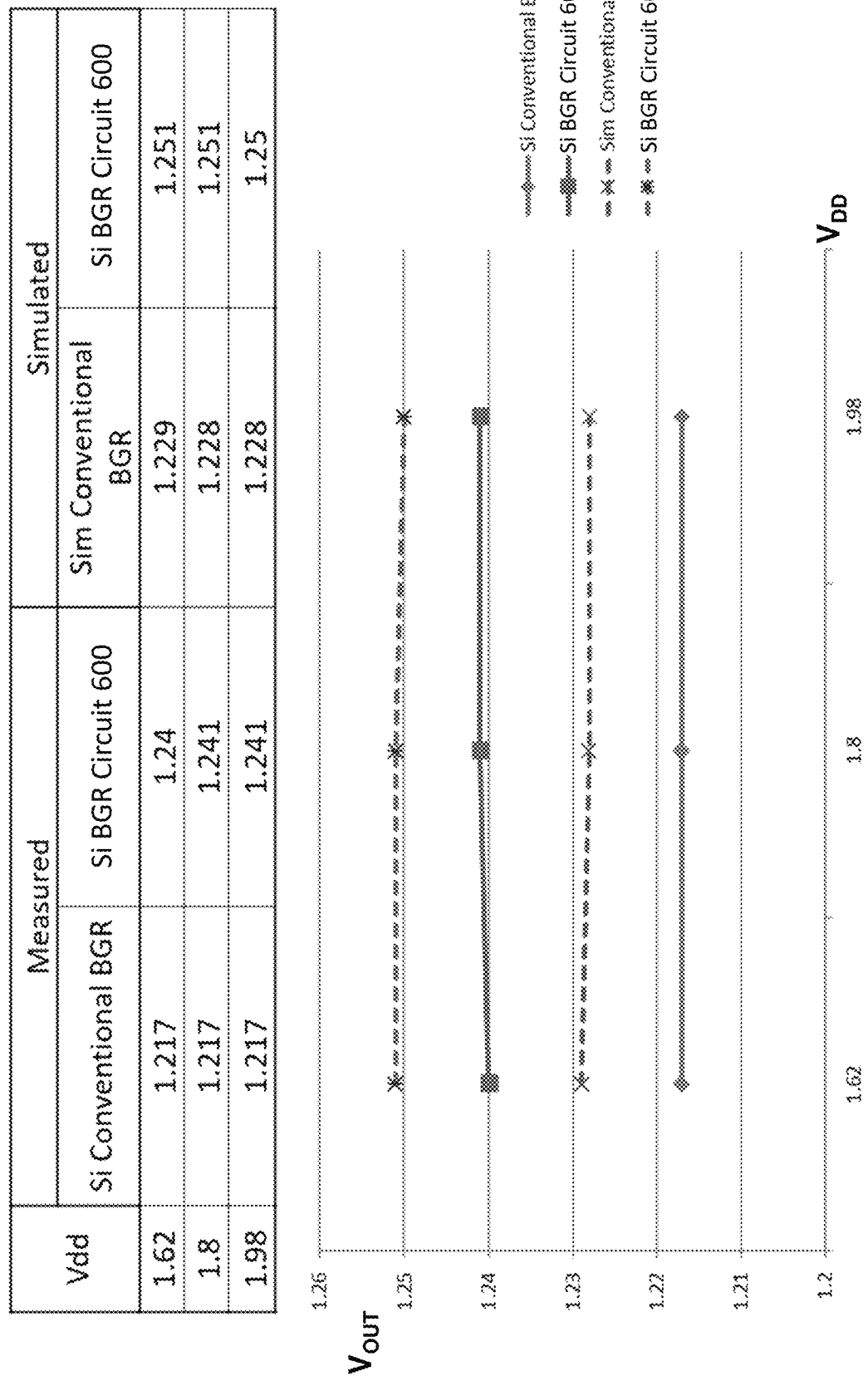
FIG. 9 depicts output voltages (measured and simulated) at different supply voltages for a conventional bandgap reference circuit and a bandgap reference circuit according to embodiments.

FIG. 8 depicts output voltages $V_{OUT}$ (measured (Si) and simulated) at different junction temperatures for a conventional bandgap reference (BGR) circuit (e.g., bandgap reference circuit 100) and the bandgap reference circuit 600 according to embodiments. FIG. 9 depicts output voltages $V_{OUT}$ (measured (Si) and simulated) at different supply voltages VDD for a conventional bandgap reference circuit (e.g., bandgap reference circuit 100) and the bandgap reference circuit 600 according to embodiments. As shown, the performance of the conventional bandgap circuit and the performance of the bandgap reference circuit 600 are comparable. For example, tithe conventional bandgap reference circuit and the bandgap reference circuit 600 according to embodiments produce an output voltage of ~1.2 V over a wide range of temperatures (FIG. 9) that is substantially independent of supply voltage VDD (FIG. 8). However, as detailed herein, the bandgap reference circuit 600 requires much less area and uses less power than conventional bandgap circuits.

Embodiments of the disclosure may provide several technical and commercial advantages, some of which here discussed herein by way of example. A structure is provided that allows an active device (e.g., a FET) to be vertically stacked above another active device (e.g., a BJT, diode, etc.) in a single device layer. In conventional IC structures, it is typically necessary to form active devices in horizontally separated areas of a single device layer, and/or to form multiple device layers for each of the different components. Additionally, embodiments of the disclosure allow multiple active devices (e.g., a FET, BJT, diode, etc.) to be combined into a smaller combined structure, thereby reducing the total surface area occupied by the active devices in a design (e.g., in a bandgap reference circuit), thereby further improving device density and reducing the surface area required to implement various IC designs.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A bandgap reference circuit, comprising:
   first and second vertically stacked structures, the first and second vertically stacked structures each including:
   a P-type substrate;
   a P-well region within the P-type substrate;
   an N-type barrier region between the P-type substrate and the P-well region, the P-well region and the N-type barrier region forming a PN junction;
   a field effect transistor (FET) above the P-well region, separated from the P-well region by a buried insulator layer, the P-well region forming a back gate of the FET; and
   a first voltage source coupled to the P-well and applying a forward bias to a diode formed at the PN junction between the P-well region and the N-type barrier region.

2. The bandgap reference circuit according to claim 1, wherein first voltage source concurrently biases the back gate of the FET.

3. The bandgap reference circuit according to claim 1, further comprising:
   a second voltage source coupled to the N-type barrier region and applying a reverse bias to a PN junction formed between the P-type substrate and the N-type barrier region; and
   a third voltage source coupled to the P-type substrate and applying a reverse bias to the PN junction formed between the P-type substrate and the N-type barrier region.

4. The bandgap reference circuit according to claim 1, wherein the N-type barrier region and the P-type substrate are connected to ground.

5. The bandgap reference circuit according to claim 1, wherein the FET in the first vertically stacked structure and the FET in the second vertically stacked structure form a current mirror.

6. The bandgap reference circuit according to claim 1, wherein the FET in each of the first and second vertically stacked structures includes a source, a drain, and a gate, and wherein the bandgap reference circuit further comprises an operational amplifier, the operational amplifier having an output coupled to the gate of the FET in each of the first and second vertically stacked structures.

7. The bandgap reference circuit according to claim 6, wherein the operational amplifier includes a first input coupled to a first node and a second input coupled to a second node, wherein the first node is coupled to a back gate of the FET in the first vertically stacked structure.

8. The bandgap reference circuit according to claim 7, wherein the bandgap reference circuit further comprises:
   a first resistor coupled between the second node and the back gate of the FET in the second vertically stacked structure;
   a second resistor coupled between the second node and the drain of the FET in the second vertically stacked structure; and
   a third resistor coupled between the first node and a drain of the FET in the first vertically stacked structure.

9. The bandgap reference circuit according to claim 8, wherein a voltage across the first resistor is a proportional to absolute temperature (PTAT) voltage, and wherein a voltage across the diode formed at the PN junction between the P-well region and the N-type barrier region in each of the first and second stacked devices is a complementary to absolute temperature (CTAT) voltage.

10. The bandgap reference circuit according to claim 9, further comprising an output node connected to the second and third resistors, the output node outputting a reference voltage.

11. The bandgap reference circuit according to claim 6, wherein the source of the FET in each of the first and second vertically stacked structures is coupled to a supply voltage.

12. An integrated circuit, comprising:
    a bandgap reference circuit for generating a reference current, the bandgap reference circuit comprising:
    first and second vertically stacked structures, the first and second vertically stacked structures each including:
    a P-type substrate;
    a P-well region within the P-type substrate;
    an N-type barrier region between the P-type substrate and the P-well region, the P-well region and the N-type barrier region forming a PN junction;
    a field effect transistor (FET) above the P-well region, separated from the P-well region by a buried insulator layer, the P-well region forming a back gate of the FET, wherein the FET in the first vertically stacked structure and the FET in the second vertically stacked structure form a current mirror; and
    a first voltage source coupled to the P-well and applying a forward bias to a diode formed at the PN junction between the P-well region and the N-type barrier region, wherein the first voltage source concurrently biases the back gate of the FET.

13. The integrated circuit according to claim 12, further comprising:
    a second voltage source coupled to the N-type barrier region and applying a reverse bias to a PN junction formed between the P-type substrate and the N-type barrier region; and a third voltage source coupled to the P-type substrate and applying a reverse bias to the PN junction formed between the P-type substrate and the N-type barrier region.

14. The integrated circuit according to claim 12, wherein the FET in each of the first and second vertically stacked structures includes a source, a drain, and a gate, and wherein the bandgap reference circuit further comprises an operational amplifier, the operational amplifier including:
an output coupled to the gate of the FET in each of the first and second vertically stacked structures; and
a first input coupled to a first node and a second input coupled to a second node, wherein the first node is coupled to a back gate of the FET in the first vertically stacked structure;
wherein the bandgap reference circuit further comprises:
a first resistor coupled between the second node and the back gate of the FET in the second vertically stacked structure;
a second resistor coupled between the second node and the drain of the FET in the second vertically stacked structure; and
a third resistor coupled between the first node and a drain of the FET in the first vertically stacked structure.

15. The integrated circuit according to claim 14, wherein a voltage across the first resistor is a proportional to absolute temperature (PTAT) voltage, and wherein a voltage across the diode formed at the PN junction between the P-well region and the N-type barrier region in each of the first and second stacked devices is a complementary to absolute temperature (CTAT) voltage.

16. The integrated circuit according to claim 14, further comprising an output node connected to the second and third resistors, the output node outputting a reference voltage.

17. A bandgap reference circuit with vertically stacked active silicon-on-insulator (SOI) devices, comprising:
a P-type substrate;
a P-well region within the P-type substrate;
an N-type barrier region between the P-type substrate and the P-well region, the P-well region and the N-type barrier region forming a PN junction;
a field effect transistor (FET) above the P-well region, separated from the P-well region by a buried insulator layer, the P-well region forming a back gate of the FET; and
a first voltage source coupled to the P-well and applying a forward bias to a diode formed at the PN junction between the P-well region and the N-type barrier region, wherein the first voltage source concurrently biases the back gate of the FET.

18. The bandgap reference circuit according to claim 17, wherein the N-type barrier region and the P-type substrate are connected to ground.

19. The bandgap reference circuit according to claim 17, further comprising a resistor coupled to the back gate of the FET, wherein a voltage across the resistor is a proportional to absolute temperature (PTAT) voltage, and wherein a voltage across the diode formed at the PN junction between the P-well region and the N-type barrier region is a complementary to absolute temperature (CTAT) voltage.

* * * * *